United States Patent
Dally

(10) Patent No.: US 9,660,599 B2
(45) Date of Patent: May 23, 2017

(54) RADIO FREQUENCY POWER AMPLIFIER INCLUDING A PULSE GENERATOR AND MATCHING NETWORK CIRCUIT

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 25 days.

(21) Appl. No.: 14/705,838

(22) Filed: May 6, 2015

(65) Prior Publication Data

US 2015/0326255 A1 Nov. 12, 2015

Related U.S. Application Data

(60) Provisional application No. 61/990,010, filed on May 7, 2014.

(51) Int. Cl.

| H04K 1/10 | (2006.01) |
|---|---|
| H04L 27/00 | (2006.01) |
| H03F 3/217 | (2006.01) |
| H04B 1/04 | (2006.01) |
| H04L 27/34 | (2006.01) |
| H03K 3/45 | (2006.01) |
| H03F 1/56 | (2006.01) |
| H03F 3/193 | (2006.01) |
| H03F 3/24 | (2006.01) |

(52) U.S. Cl.
CPC .......... *H03F 3/2175* (2013.01); *H03F 1/565* (2013.01); *H03F 3/193* (2013.01); *H03F 3/245* (2013.01); *H03K 3/45* (2013.01); *H04B 1/04* (2013.01); *H04L 27/3411* (2013.01); *H03F 2200/171* (2013.01); *H03F 2200/387* (2013.01); *H04B 2001/0408* (2013.01)

(58) Field of Classification Search
CPC .. H04B 2001/0408; H04B 1/16; H04B 17/13; H04B 1/06; H04B 1/38; H04B 7/0465
USPC .......................................... 375/260; 330/295
See application file for complete search history.

(56) References Cited

U.S. PATENT DOCUMENTS

| 5,504,457 A * | 4/1996 | Jensen ................. H03G 3/3047 330/129 |
|---|---|---|
| 2007/0075804 A1* | 4/2007 | Otsuka .......................... 333/133 |

(Continued)

OTHER PUBLICATIONS

Sander, W. B. et al., "Polar Modulator for Multi-mode Cell Phones," Proceedings of the IEEE 2003 Custom Integrated Circuits Conference, Sep. 2003, pp. 1-7.

(Continued)

*Primary Examiner* — Daniel Washburn
*Assistant Examiner* — Sarah Hassan
(74) *Attorney, Agent, or Firm* — Zilka-Kotab, PC

(57) ABSTRACT

A system and method are provided for controlling a radio frequency (RF) power amplifier. A magnitude input and a phase input are received for transmission of a RF signal by the RF power amplifier. A digital pulse, having a center position relative to an edge of a reference clock based on the phase input and having a width based on the magnitude input, is generated. The digital pulse is filtered with a resonant matching network to produce the RF signal corresponding to the magnitude input and the phase input.

18 Claims, 15 Drawing Sheets

(56) References Cited

U.S. PATENT DOCUMENTS

| | | | | |
|---|---|---|---|---|
| 2009/0054075 | A1* | 2/2009 | Boejer | G01S 19/09 455/456.1 |
| 2009/0283257 | A1* | 11/2009 | Becker | E21B 43/2401 166/248 |
| 2010/0008432 | A1* | 1/2010 | Kim | H04L 5/0007 375/260 |
| 2010/0052743 | A1* | 3/2010 | Kamizuma | G06F 13/4243 327/144 |
| 2010/0073103 | A1* | 3/2010 | Spears | H03H 7/40 333/17.3 |
| 2010/0124891 | A1* | 5/2010 | Lin et al. | 455/143 |
| 2010/0188148 | A1* | 7/2010 | Mehta et al. | 330/149 |
| 2011/0267127 | A1 | 11/2011 | Staszewski et al. | |
| 2011/0268201 | A1* | 11/2011 | Kludt | H04B 7/0877 375/259 |
| 2012/0038424 | A1* | 2/2012 | Guo | H03F 3/211 330/295 |
| 2013/0023201 | A1* | 1/2013 | Coleman | H04K 3/45 455/1 |
| 2013/0162248 | A1* | 6/2013 | Haishi | G01R 33/54 324/307 |

OTHER PUBLICATIONS

McCune, E., "Polar Modulation and Bipolar RF Power Devices," IEEE BCTM 1.1, 2005, pp. 1-5.

Office Action from Taiwanese Patent Application No. 104114551, dated May 26, 2016.

Park et al., "An Amplitude Resolution Improvement of an RF-DAC Employing Pulsewidth Modulation," IEEE Transactions on Circuits and Systems I: Regular Papers, vol. 58, No. 11, Nov. 2011, pp. 1-14.

Moghtadaei et al., "A 90 nm-CMOS IR-UWB BPSK Transmitter With Spectrum Tunability to Improve Peaceful UWB-Narrowband Coexistence," IEEE Transactions on Circuits and Systems I: Regular Papers, vol. 51, No. 6, Jan. 2014, pp. 1-13.

Park et al., "A Time-Domain Resolution Improvement of an RF-DAC," IEEE Transactions on Circuits and Systems II: Express Briefs, vol. 57, No. 7, Jul. 2010, pp. 517-521.

Su et al., "A 2.4 GHz Wideband Open-Loop GFSK Transmitter With Phase Quantization Noise Cancellation," IEEE Journal of Solid-State Circuits, vol. 46, No. 3, Mar. 2011, pp. 615-626.

\* cited by examiner

US 9,660,599 B2

RADIO FREQUENCY POWER AMPLIFIER INCLUDING A PULSE GENERATOR AND MATCHING NETWORK CIRCUIT

CLAIM OF PRIORITY

This application claims the benefit of U.S. Provisional Application No. 61/990,010, titled "Radio Frequency Power Amplifier including a Pulse Generator and Tank Circuit," and filed May 7, 2014, the entire contents of which is incorporated herein by reference.

FIELD OF THE INVENTION

The present invention relates to power amplifier circuits, and more specifically to radio frequency power amplifier circuits.

BACKGROUND

Modern cell phone radio frequency (RF) power amplifiers must operate with high linearity to support modern constellations. When operating with high linearity, the RF power amplifiers are typically less than 50% efficient, even with envelope modulation. Efficiency is particularly bad when the ratio of peak to average output power is large. Designs that combine the outputs of multiple oscillators require multiple power stages and have additional losses due to currents circulating between the multiple power stages.

Thus, there is a need for addressing these issues and/or other issues associated with the prior art.

SUMMARY

A system and method are provided for controlling a radio frequency (RF) power amplifier. A magnitude input and a phase input are received for transmission of a RF signal by the RF power amplifier. A digital pulse, having a center position relative to an edge of the reference clock based on the phase input and having a width based on the magnitude input, is generated. The digital pulse is filtered with a resonant matching network to produce the RF signal corresponding to the magnitude input and the phase input.

DETAILED DESCRIPTION

A RF power amplifier may be efficiently operated by generating a digital signal of periodic digital pulses at the RF frequency. Each digital pulse has a controlled pulse width and a controlled pulse phase relative to a reference clock. The pulse width of a digital pulse corresponds to the magnitude of the signal (with 0.5 UI being unit magnitude) and the center of the digital pulse corresponds to the phase relative to the RF frequency. A RF power amplifier using the controlled digital pulses may be 80-90% efficient compared with conventional RF power amplifiers that may only be 20-25% efficient.

Figure 1A:
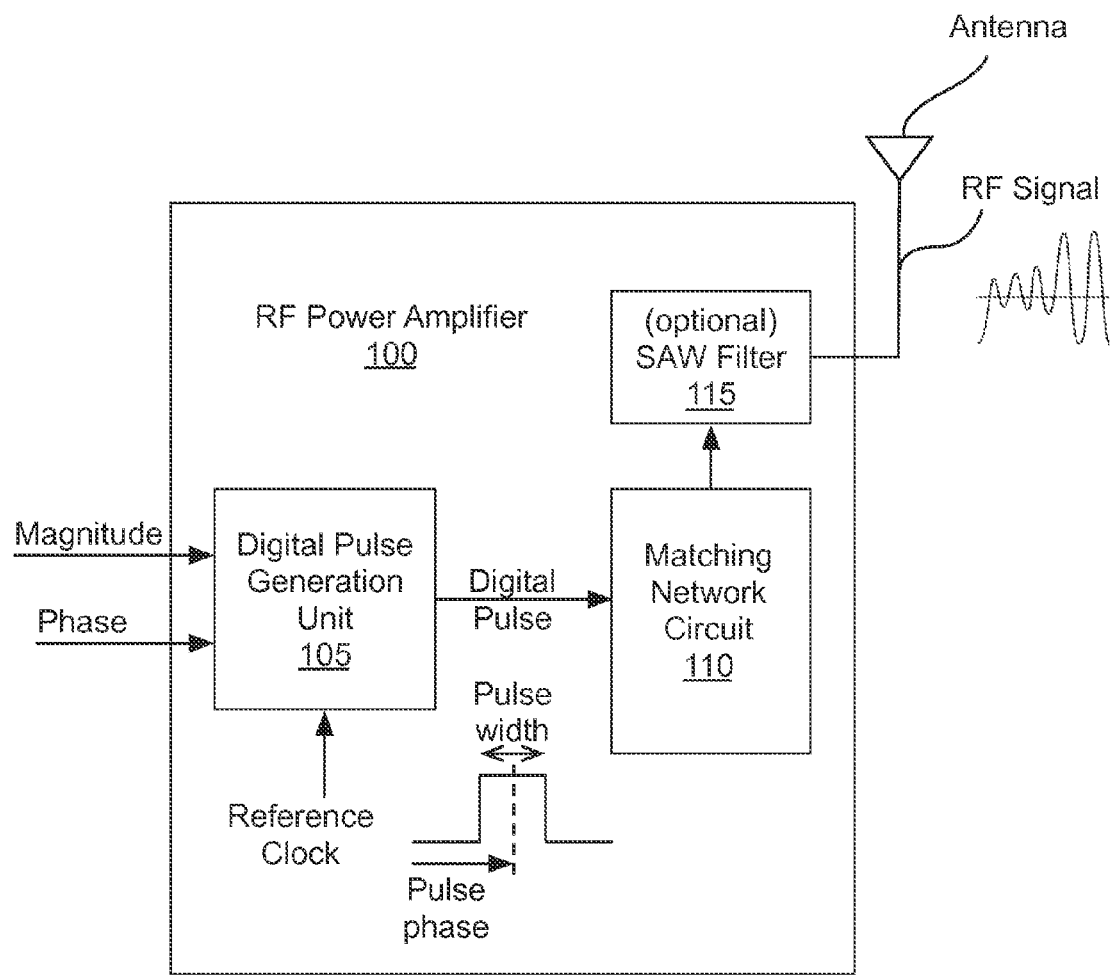
FIG. 1A illustrates an RF power amplifier, in accordance with one embodiment.

FIG. 1A illustrates a RF power amplifier 100 including a digital pulse generation unit 105 and a matching network circuit 110, in accordance with one embodiment. The RF power amplifier 100 operates as a digitally-controller RF signal generator. Inputs to the digital pulse generation unit 105 are a reference clock and digital inputs encoding a magnitude and phase. In one embodiment, the reference clock is a digital clock signal at the output transmission frequency (i.e., RF). The phase is measured from an edge of the reference clock to the center of the digital pulse that is generated by the digital pulse generation unit 105. The magnitude is measured as the width of the digital pulse that is generated by the digital pulse generation unit 105.

The digital pulse generated by the digital pulse generation unit 105 is input to the matching network circuit 110. In one embodiment, the matching network circuit 110 is a tank circuit. The tank circuit serves two purposes. The first purpose is to function as a resonant matching network and resonate at the output transmission frequency, thereby converting the digital pulses to the analog RF signal. The second purpose is to transform a low impedance at the input of the matching network circuit 110 to match a higher impedance at the antenna. The tank circuit may have a Q less than the reciprocal of the fractional bandwidth of the system. For example, for a system with a 10 MHz bandwidth at 2.4 GHz, the fractional bandwidth is 0.42% and Q is typically 40-80. The fundamental tone of the digital pulses is passed by the tank circuit and the odd harmonics are attenuated by 20 dB or more. Additional attenuation of harmonics can be achieved, if needed, by using a surface acoustic wave (SAW) filter 115 between the matching network circuit 110 and the antenna. When the SAW filter 115 is not included, the matching network circuit 110 outputs the RF signal directly (i.e., the matching network circuit 110 is directly coupled to the antenna).

The energy coming out of the digital pulse generation unit 105 is primarily at the fundamental frequency. The first overtone is the $3^{rd}$ harmonic with ⅓ amplitude (−9.5 dB). The matching network circuit 110 attenuates the amplitude by an additional 9.5 dB producing an RF signal that is 19 dB down before the SAW filter 115. The SAW filter 115 will further reduce the amplitude of the harmonics by an additional 20 dB or more in the frequency range making the first overtone at least 40 dB down from the fundamental tone. In one embodiment, the waveforms driving the oscillator may be generated to include additional pulses that reduce and even eliminate the third harmonic.

The matching network circuit 110 drives an antenna that, in one embodiment, appears as a 50 ohm load. The RF power amplifier 100 may include a transformer to convert the load for the matching network circuit 110 (or the SAW filter 115) to a different impedance.

In one embodiment, the digital pulse generation unit 105 includes one or more field effect transistors (e.g., metal-oxide semiconductor (MOS) FETs). Rather than operating the FETs in the linear region, as with a conventional RF amplifier, the FETs in the digital pulse generation unit 105 are either on or off. Therefore, power losses due to linear operation are greatly reduced, if not eliminated, leaving only small losses of power due to switching. The matching network circuit 110 controls the amplitude and phase of the RF signal so that the only dissipation is in the conduction loss of the elements within the matching network circuit 110. Additionally, the intermediate frequency (IF) section and mixer that is included in radio systems using conventional RF amplifiers is not needed.

Figure 1B:
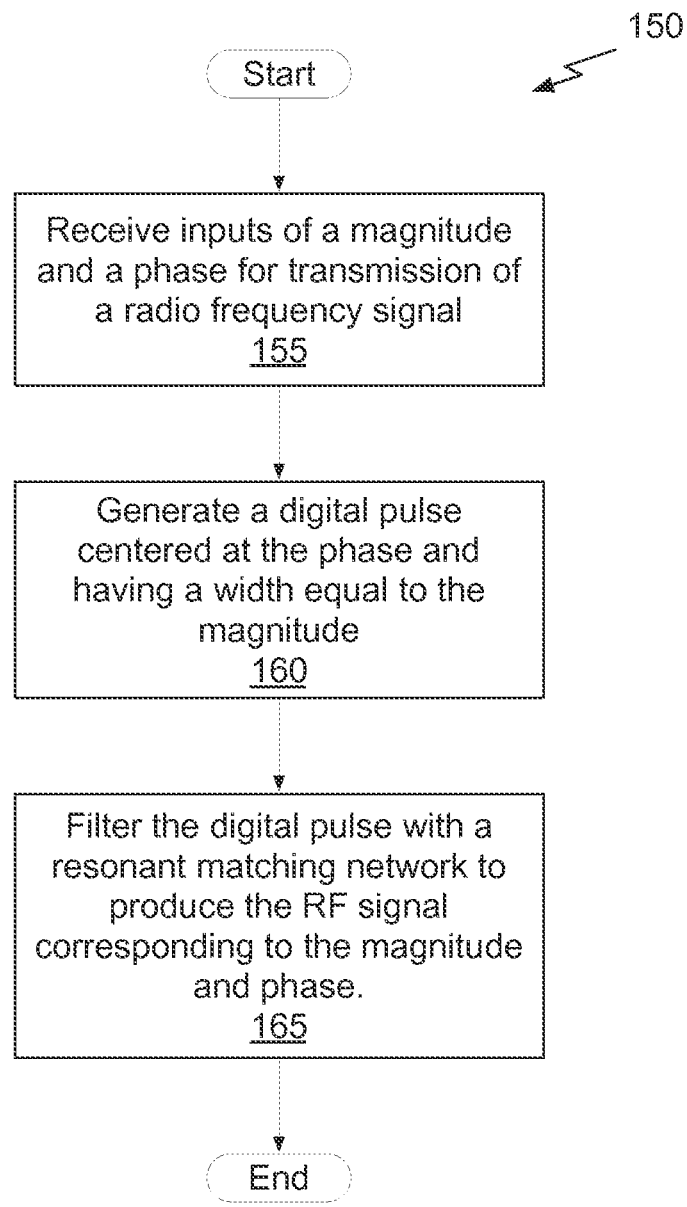
FIG. 1B illustrates a flowchart of a method for generating a signal for transmission using the RF power amplifier shown in FIG. 1A, in accordance with one embodiment.

FIG. 1B illustrates a flowchart of a method 150 for generating a signal for transmission using the RF power amplifier 100 shown in FIG. 1A, in accordance with one embodiment. At step 155, a magnitude input and a phase input are received for transmission of a RF frequency signal by the RF power amplifier 100. At step 160, a digital pulse centered at the phase and having a width equal to the magnitude is generated by the digital pulse generation unit 105. A center position of the digital pulse is coincident with the phase input. At step 165, the digital pulse is filtered with a resonant matching network, such as the matching network circuit 110, to produce the RF signal corresponding to the magnitude and phase.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
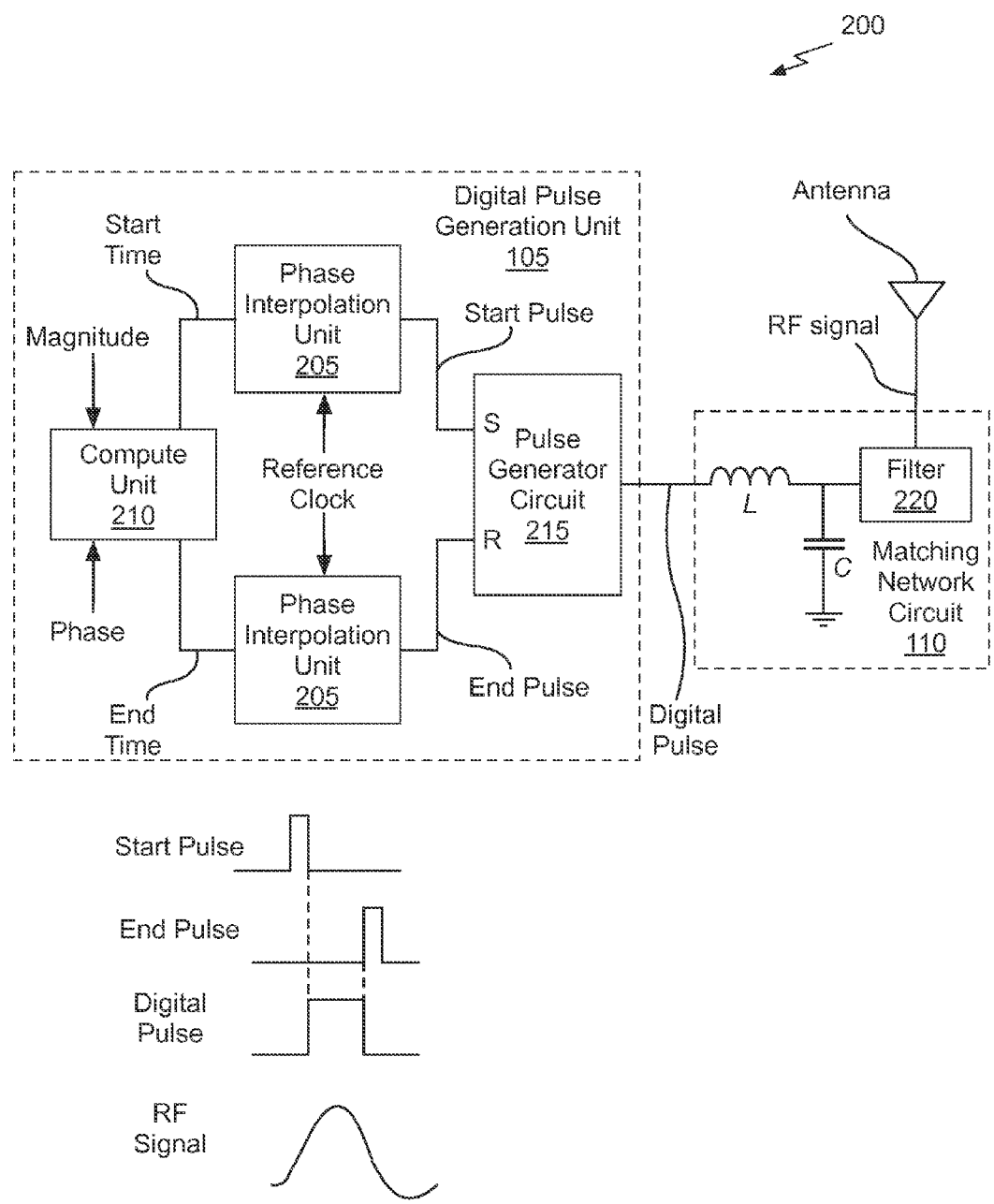
FIG. 2A illustrates block diagram of the RF power amplifier shown in FIG. 1A, in accordance with one embodiment.

FIG. 2A illustrates a block diagram of the RF power amplifier 100 shown in FIG. 1A, in accordance with one embodiment. The RF power amplifier 100 includes the digital pulse generation unit 105 and the matching network circuit 110. The digital pulse generation unit 105 includes a compute unit 210, two phase interpolation units 205, and a pulse generator circuit 215. The compute unit 210 receives the magnitude and phase inputs and computes a start time and an end time for each digital pulse to be generated relative to the reference clock. A digital pulse is generated for each cycle of the reference clock. The magnitude and phase inputs are digital values. The phase and magnitude inputs directly represent the center position of the digital pulse and the width of the digital pulse—in UI (unit interval). The start time is computed by subtracting half the pulse width from the center of the digital pulse (i.e., start time=phase−magnitude/2) and the stop time is computed by adding the start time to the pulse width. The start and end times control the two phase interpolator units 205 that generate the digital start and end pulses for the pulse generator circuit 215.

In one embodiment, the compute unit 210 receives In-phase I and quadrature Q components corresponding to a symbol, and the I and Q components are directly translated into the phase and magnitude inputs. A symbol is represented as complex numbers that define points on the complex plane (formed by in-phase, I, and quadrature, Q, axes). The points for a set of modulation symbols correspond to a constellation diagram. The constellation diagram represents a signal that is modulated using quadrature amplitude modulation. In one embodiment, the I and Q components are received synchronized to a symbol clock. For a 64-QAM symbol, each of I and Q are 3 bits. To avoid precision loss due to format conversion, in one embodiment, the I and Q components are translated by the compute unit 210 to a higher precision phase-magnitude representation to produce 6 bits of phase and 5 bits of magnitude. This translation from I and Q to magnitude and phase is a translation from rectangular coordinates to polar coordinates and can be accomplished, for example, using the CORDIC algorithm.

Conceptually, the phase interpolation units 205 convert the start and end times to start pulse and end pulse signals that set and reset an RS flip-flop to generate the digital pulse. Any non-linearity in the phase interpolation unit 205 can be corrected with a look-up table. In one embodiment, the look-up table provides a correction as an input to the phase interpolation unit 205 that is closest to the correct pulse start and/or end time. In one embodiment, a rising edge into the S input of the pulse generator causes the digital pulse to be driven high. A rising edge into the R input of the pulse generator causes the digital pulse to be driven low. The digital pulse is filtered by a matching network circuit 115 to generate the RF signal. The matching network circuit 110 is shown as an LC tank circuit and a filter 220 in FIG. 2A. The tank circuit is tuned to resonate at the transmission frequency. In one embodiment, the filter 220 is a SAW filter. In one embodiment, the filter 220 is omitted and the node between the inductor L and capacitor C is coupled directly to the antenna.

Figure 2B:
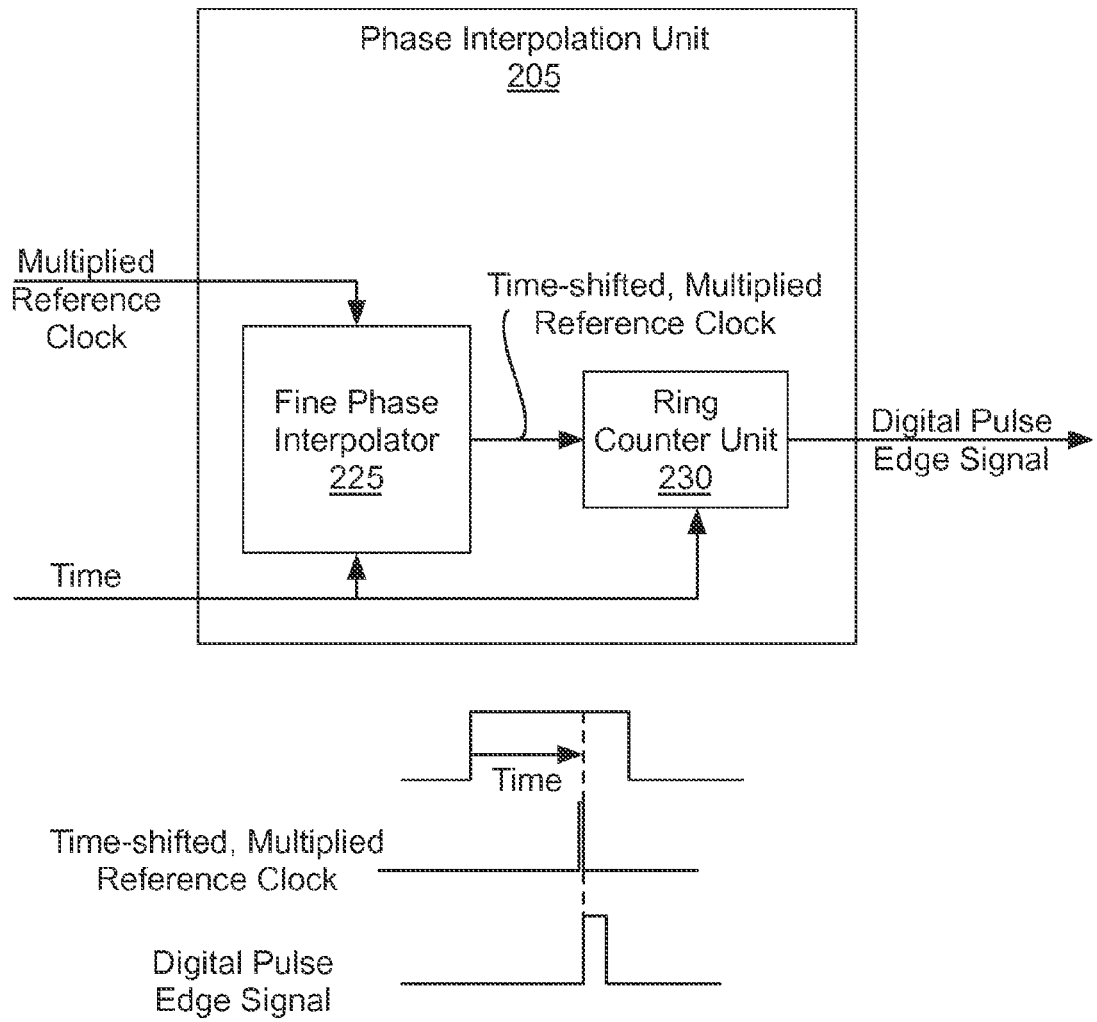
FIG. 2B illustrates the phase interpolation unit shown in FIG. 2A, in accordance with one embodiment.

FIG. 2B illustrates the phase interpolation unit 205 shown in FIG. 2A, in accordance with one embodiment. The phase interpolation unit 205 includes a fine phase interpolator 225, and a ring counter unit 230. The fine phase interpolator 225 receives a time (e.g., start time or end time) and a multiplied reference clock and generates a shifted version of the multiplied reference clock, time-shifted, multiplied reference clock. In the preferred embodiment, the multiplied reference clock operates at 8× the reference clock frequency—e.g., 16 GHz for a 2 GHz carrier. The time-shifted, multiplied reference clock is phase shifted by at least a portion of the value of the time input. The ring counter unit 230 also receives the time input and both divides down the time-shifted, multiplied reference clock and phase shifts the divided time-shifted, multiplied reference clock by an integer number of multiplied reference clock cycles as needed to produce the digital pulse edge signal so that the rising edge of the digital pulse edge signal occurs at a phase shift (relative to the reference clock) specified by the time input.

The most significant bits of the phase interpolation are performed by the ring counter unit 230—shifting by whole clock cycles of the multiplied reference clock. The least significant bits of the phase interpolation are performed by the fine phase interpolator 225—selecting the phase within one cycle of the multiplied reference clock. In a preferred embodiment, the ring counter 230 divides by 8 and the most significant 3 bits of the time signal selects one of the 8 output phases from the ring counter. Also in the preferred embodiment the fine phase interpolator 225 accepts a 5-bit input signal and selects one of 32 fine phase shifts within a multiplied reference clock cycle.

Figure 2C:
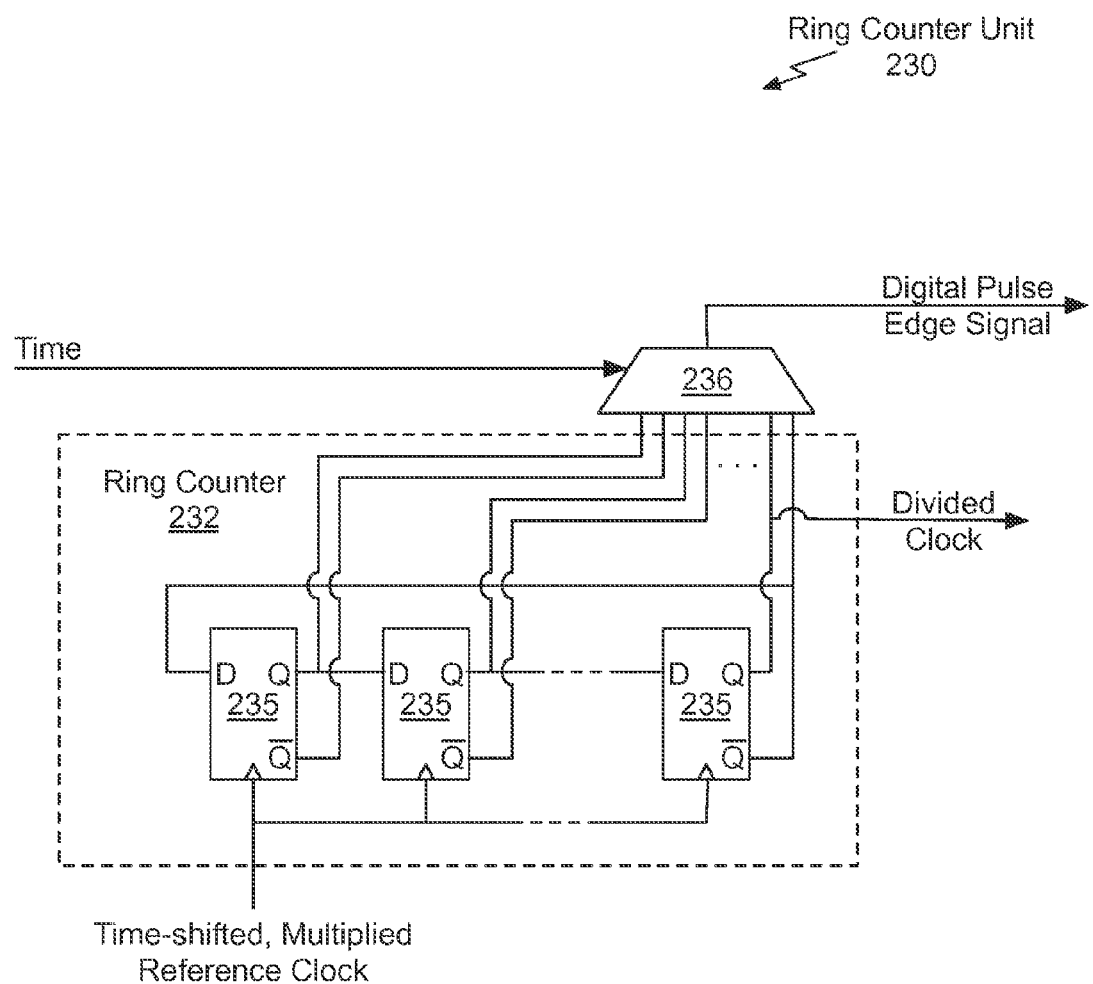
FIG. 2C illustrates the ring counter unit shown in FIG. 2B, in accordance with one embodiment.

FIG. 2C illustrates the ring counter unit 230 shown in FIG. 2B, in accordance with one embodiment. The ring counter unit 230 includes a ring counter 232 and a multiplexer 236. The ring counter 232 receives the time-shifted, multiplied reference clock and generates multiple phase-shifted versions of the time-shifted, multiplied reference clock. The multiplexer 236 selects one of the multiple phase-shifted versions of the time-shifted, multiplied reference clock for output as a digital pulse edge signal. The multiplexer 236 selects one of the multiple phase-shifted versions of the time-shifted, multiplied reference clock based on the time input. In one embodiment, four flip-flops 235 are coupled in series to generate eight phase-shifted versions of the reference clock (Q and Q-bar out of each flip-flop 235). The time-shifted, multiplied reference clock is coupled to each of the flip-flops 235 and a last flip-flop outputs a divided clock—the reference clock at the carrier frequency. When four flip-flops 235 are coupled in series, the output clock is ⅛ the frequency of the time-shifted, multiplied reference clock. For example, in one embodiment, the time-shifted, multiplied reference clock frequency is 16 GHz, the divided clock frequency is 2 Ghz. The time input is used to select one of the phase shifted versions of the time-shifted, multiplied reference clock that is output by each of the flip-flops 235 for output as the digital pulse edge signal. When the ring counter 230 is reset, each of the flip-flops 235 outputs a logic low. After the reset signal is removed, the first flip-flop 235 outputs a high value that is propagated by each successive flip-flop 235 on each rising clock edge until the logic high propagates to the input of the first flip-flop 235 which then outputs the inverted value, e.g., a logic low.

Figure 2D:
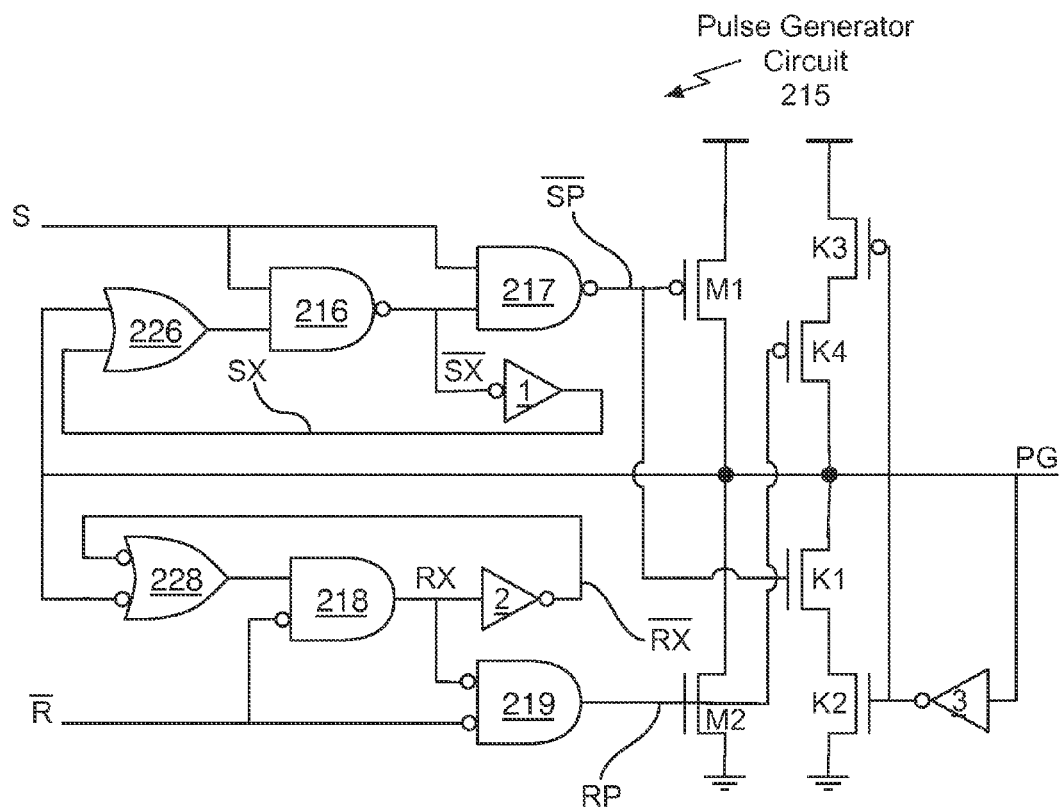
FIG. 2D illustrates the pulse generation circuit shown in FIG. 2A, in accordance with one embodiment.

FIG. 2D illustrates the pulse generator circuit 215 shown in FIG. 2A, in accordance with one embodiment. The pulse generator circuit 215 avoids shoot-through current during transitions by ensuring that only one of the transistors M1 and M2 is enabled at any time. As shown in FIG. 2D, the transistor M1 is a PMOS (p-type metal oxide semiconductor) FET and M2 is an NMOS (n-type metal oxide semiconductor) FET. When either the transistor M1 or M2 is enabled, the output PG is driven to a logic high or low, respectively, until PG transitions. After PG transitions, the drive is reduced so that the logic high or low is held. Therefore, during a transition, PG is driven strongly and after the transition, PG is driven weakly.

The OR 226, NAND 216, and inverter 1 form an RS flip-flop with output SX that is set when the output PG goes high and cleared when signal S goes low. In a similar manner the OR 228, gate 218, and inverter 2 form a second RS flip flop with output RX that is set when the output PG goes low and cleared when input R-bar goes high. These flip-flops act to disable the large transistors M1 and M2 once the transition is complete. The rising edge on the S input drives SP-bar to a logic low that enables a pull-up device (e.g., transistor M1) and disables a pull-down keeper transistor K1. The signals are timed so that the pull-down keeper K1 is disabled before the driving transistor M1 is enabled. When PG rises, it sets signal SX disabling the gate drive to transistor M1 and disables the pull-down keeper transistor K2. PG-bar, generated by an inverter 3 falls and disables the pull-down keeper transistor K2 and enables a pull-up keeper transistor K3. The pull-up keeper transistors K3 and K4 maintain the logic high at PG after transistor M1 is disabled. The pull-down keeper transistor K1 is enabled when SP-bar rises and transistor M1 is disabled. However, the pull-down keeper transistor K2 is disabled, minimizing losses.

A falling edge on the R-bar input drives signal RP high enabling the pull-down device (e.g., transistor M2) and disabling the pull-up keeper transistor K4. Again the timing is adjusted to ensure break-before-make operation (i.e., that the pull-up keeper transistor K4 is disabled before M2 is enabled). When signal PG falls, it sets the RS flip-flop causing signal RX to rise and RP to fall—disabling pull-down transistor M2 and disabling the pull-up keeper transistor K3. PG-bar rises and enables the pull-down keeper transistor K2 and disables the pull-up keeper transistor K3. The pull-down keeper transistors K1 and K2 maintain the logic low at PG after transistor M2 is disabled. Minimizing losses due to conduction overlap and other sources in the pulse generator circuit 215 is important because a typical RF power amplifier system will output 0.5 W of power or more. The pull-up keeper transistor K4 is enabled when RP falls and transistor M2 is disabled. However, the pull-up keeper transistor K3 is disabled, minimizing losses.

Figure 2E:
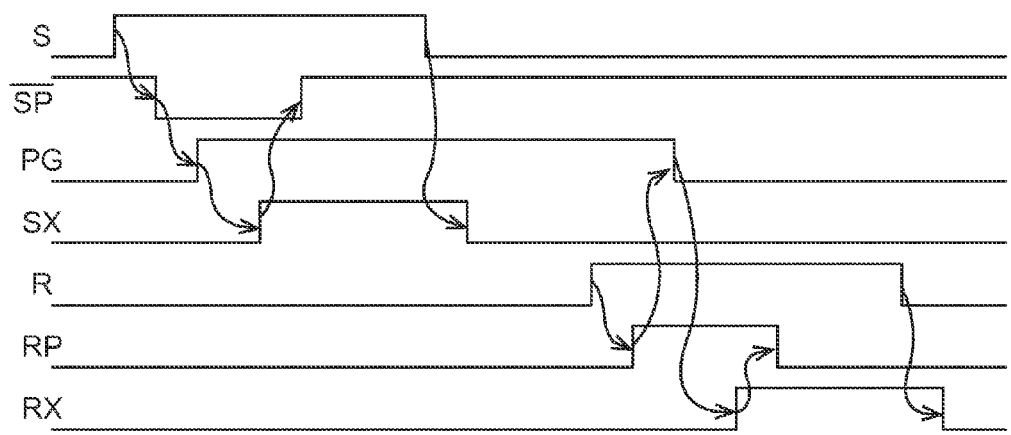
FIG. 2E illustrates a signal timing diagram of the pulse generator circuit 215 shown in FIG. 2D, in accordance with another embodiment.

FIG. 2E illustrates a signal timing diagram of the pulse generator circuit 215 shown in FIG. 2D, in accordance with another embodiment. When S is asserted (e.g., transitions from false to true) the transistor M1 is enabled by $\overline{SP}$ to pull up PG to true. PG feeds back to control SX, so that PG rising causes SX to also rise and, in response, $\overline{SP}$ is asserted. When $\overline{SP}$ is asserted, M1 is disabled and PG is no longer driven. S is negated (e.g., transitions from true to false) and, in response, SX is also negated. Then R is asserted and the transistor M2 is enabled by RP to pull down PG to false. PG feeds back to control RX, so that PG falling causes RX to rise and RP is negated. When RP is negated, M2 is disabled and PG is no longer driven. When R is negated, and, in response, RX is also negated.

Figure 2F:
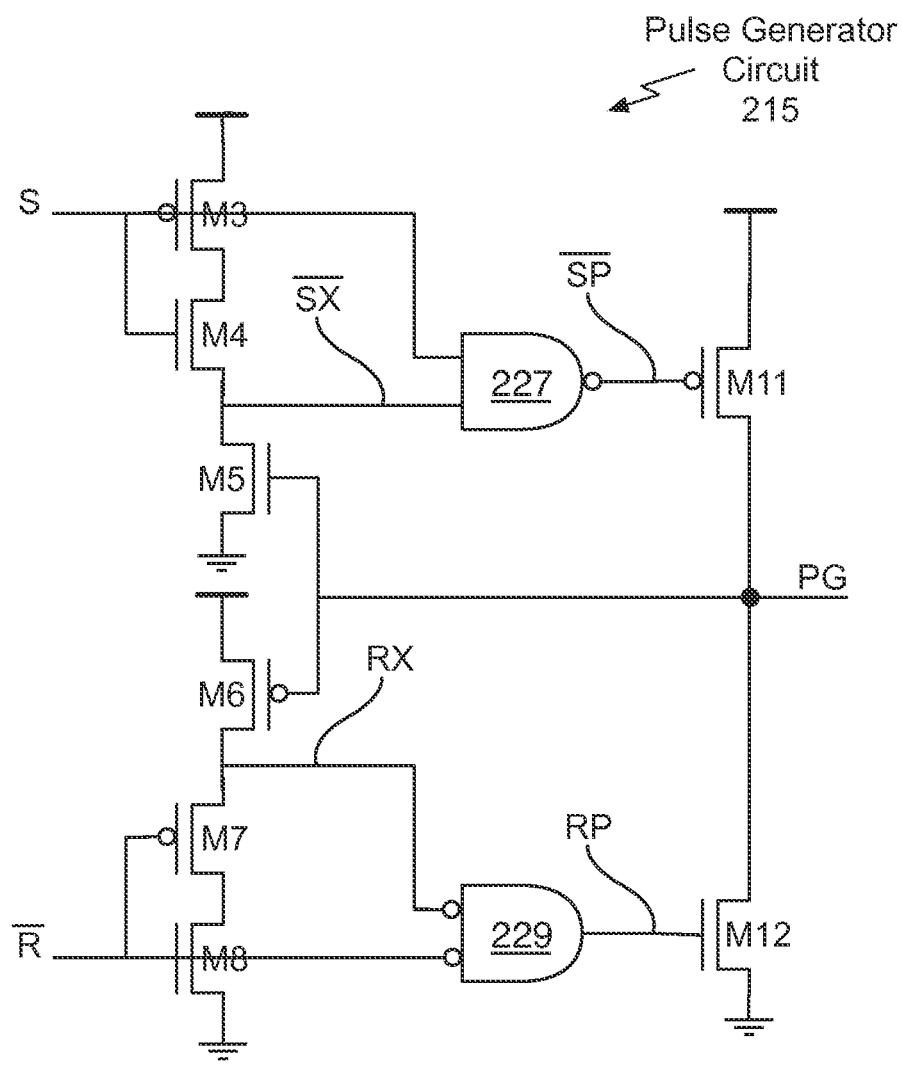
FIG. 2F illustrates the pulse generation circuit shown in FIG. 2A, in accordance with one embodiment.

FIG. 2F illustrates the pulse generator circuit 215 shown in FIG. 2A, in accordance with another embodiment. The pulse generator circuit 215 is an optimized version of the pulse generator circuit 215 shown in FIG. 2D. The static RS flip-flops in FIG. 2D are replaced with dynamic RS flip-flops. Specifically, the logic gates 227 and 229 correspond to logic gates 217 and 219 of FIG. 2D, respectively. The remaining logic gates in FIG. 2D are replaced with the transistors M3, M4, M5, M6, M7, and M8. At typical RF frequencies the intermediate nodes $\overline{SX}$ and RX are allowed to float between assertions of either S or R.

One of ordinary skill will understand that, in one embodiment, transistors M1 and M2 in FIG. 2D and M11 and M12 in FIG. 2F are very large transistors and may require an exponentially-sized chain of pre-drivers (not shown) to amplify signals SP-bar and RP before driving the very large gate capacitance of these power devices.

Figure 3A:
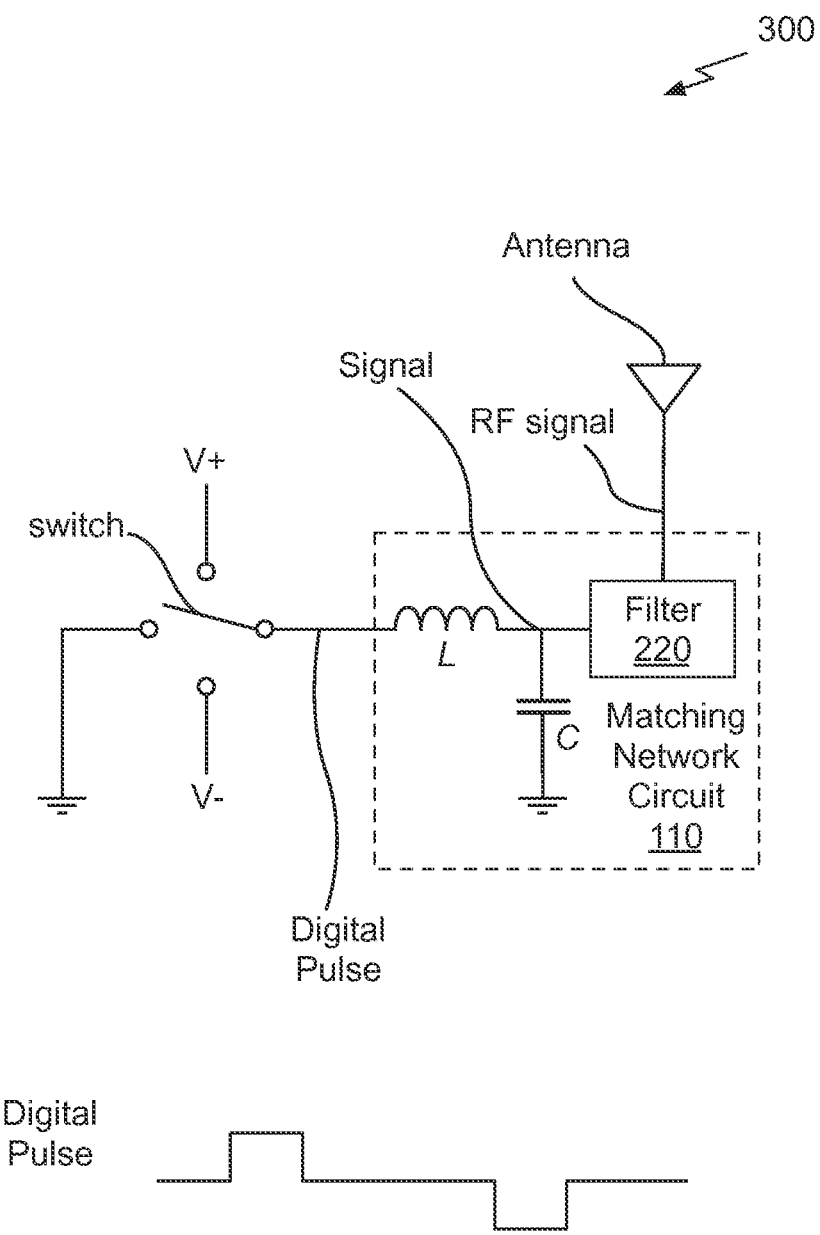
FIG. 3A illustrates a conceptual RF power amplifier using a three-position switch, in accordance with one embodiment.

FIG. 3A illustrates a conceptual RF power amplifier system 300 using a three-position switch, in accordance with one embodiment. The RF power amplifier system 300 includes the matching network circuit 110, antenna, and a three position switch in place of the digital pulse generation unit 105 shown in FIGS. 1A and 2A. Use of the three position switch enables generation of positive digital pulses and negative digital pulses to produce the RF signal. Energy is pumped into (or out of) the matching network circuit 110 by the three position switch to control the amplitude and phase of the digital pulse. When the switch is in the middle position the tank circuit formed by the inductor L and the capacitor C in the matching network circuit 110 freewheels and the loss is negligible. When the switch is in the upper (V+) position the tank circuit is pumped so as to increase the current through (or energy stored in) the inductor L. Similarly, when the switch is in the lower position (V−) the tank circuit is also pumped to increase the magnitude of the current in the inductor L, which is flowing in the reverse direction when the switch is in the lower position. In one embodiment, V+ is the VDD supply voltage and V− is the ground supply voltage. In this embodiment the middle position of the switch is connected to an intermediate voltage. To reinforce a particular phase, the upper switch is turned on with a pulse centered on the rising zero crossing for the phase and the lower switch is turned on with a pulse centered on the falling zero crossing for the phase. A phase can be attenuated by reversing the two digital pulses.

Figure 3B:
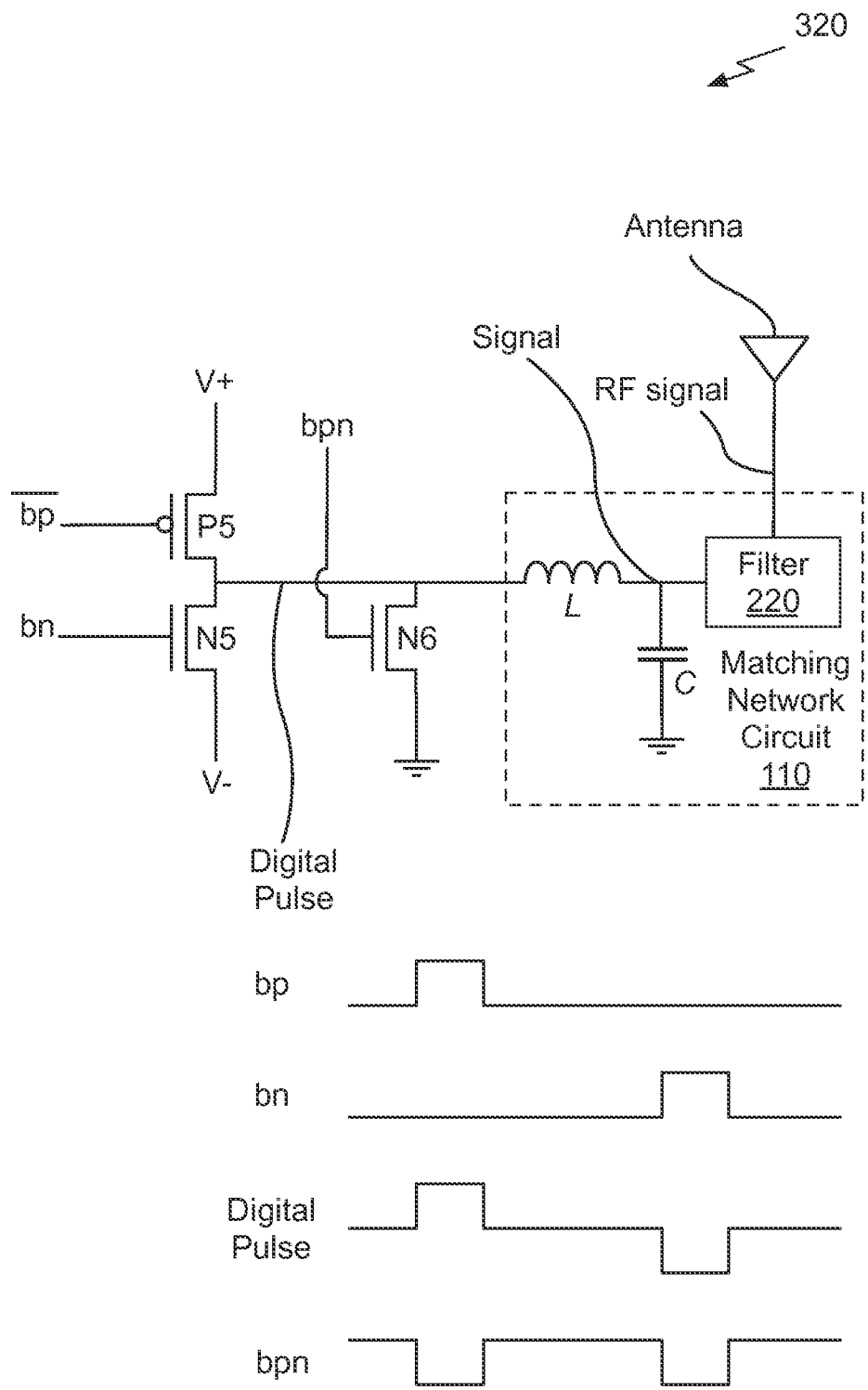
FIG. 3B illustrates a RF power amplifier system, in accordance with one embodiment.

FIG. 3B illustrates a RF power amplifier system 320, in accordance with one embodiment. The three position switch shown in the RF power amplifier system 300 is replaced with a PMOS transistor P5 and NMOS transistors N5 and N6. In one embodiment, V+ is the VDD supply voltage and V− is the ground supply voltage. When signal by is true (logic high) the current in the inductor L increases and the voltage across the capacitor C increases—reinforcing the phase that has a voltage minimum at the center of the digital pulse. When signal bn is true the current in the inductor L is reversed and the voltage across the capacitor C decreases—reinforcing the phase that has a voltage minimum at the center of the digital pulse. When signals bp and bn are false, bpn is true, transistor N6 is enabled and the tank circuit freewheels.

Figure 3C:
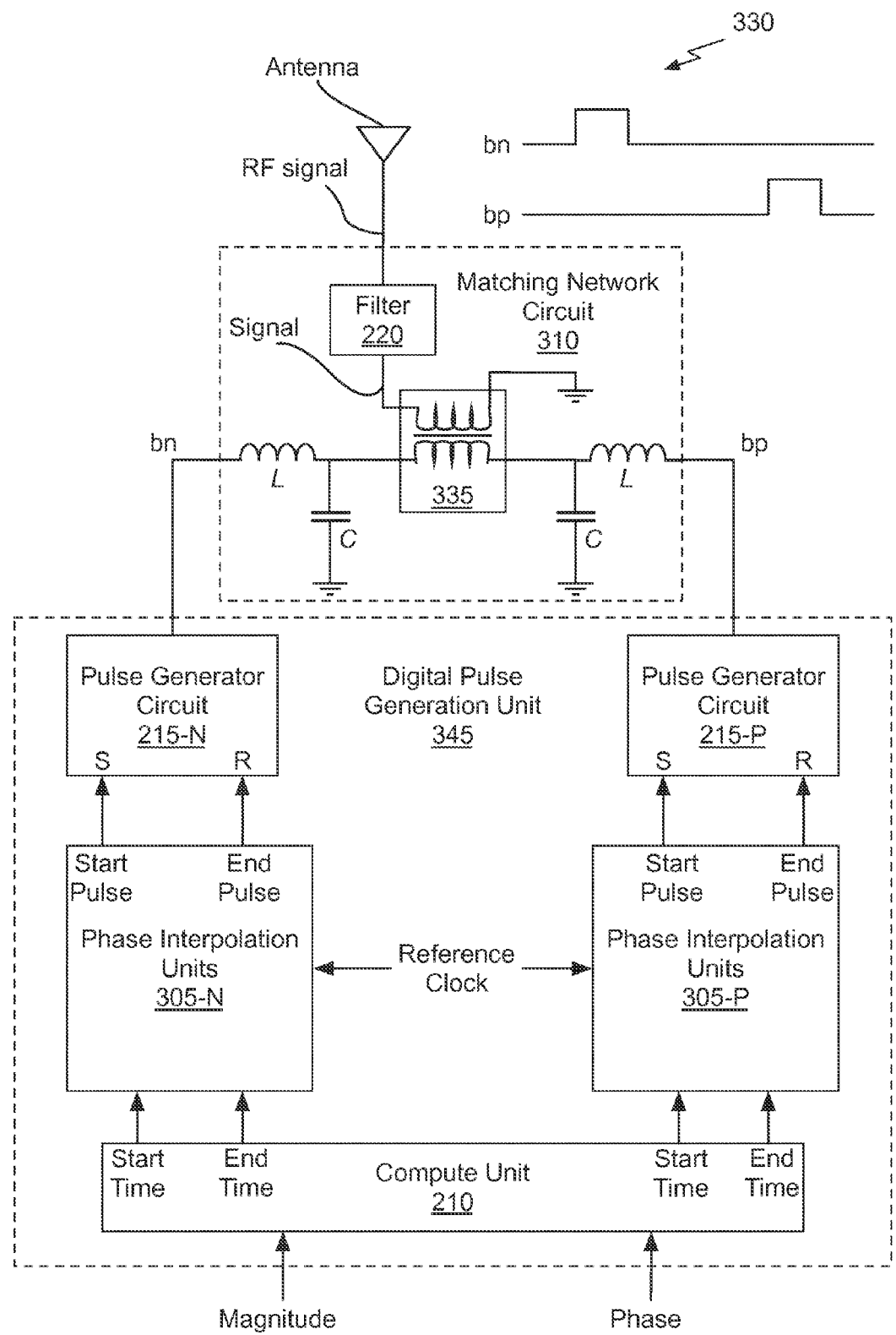
FIG. 3C illustrates a RF power amplifier system including a transformer, in accordance with another embodiment.

FIG. 3C illustrates a RF power amplifier system 330 including a transformer 335, in accordance with another embodiment. In one embodiment the transformer 335 is a transmission-line transformer that may be formed by two traces on a printed circuit board, where each trace corresponds to a winding. The RF power amplifier system 300 includes a digital pulse generation unit 345, a matching network circuit 310 and an antenna. The digital pulse generation unit 345 includes the compute unit 210, two phase interpolation units 305, and two pulse generator circuits 215. The matching network circuit 310 includes the transformer 335, the filter 220, and two tank circuits that are coupled to opposing terminals of a primary winding or trace of the transformer 335. The phase interpolation units 305-N and pulse generator circuit 215-N correspond to the digital pulse signal bn and the phase interpolation units 305-P and pulse generator circuit 215-P correspond to the digital pulse signal bp.

The compute unit 210 receives the magnitude and phase inputs and computes a start time and an end time for the digital pulse. However, instead of generating positive digital pulses, two equal-width digital pulse signals, bn and bp, 180-degrees out of phase, are generated relative to the reference clock. In one embodiment, during a second half of a cycle of the reference clock, a second digital pulse having a phase displaced 0.5 UI from a phase of the first pulse and having a width equal to the first pulse is generated. Each phase interpolation unit 305 outputs a phase-shifted reference clock, such that an output of the phase interpolation units 305-N is 180-degrees out of phase compared with the output of the phase interpolation units 305-P. The phase interpolation units 305-N drives the pulse generator circuit 215-N. The phase interpolation units 305-P drives the pulse generator circuit 215-P. A digital pulse bn is generated during a first half of a cycle of the reference clock (i.e., while the clock is low) and a digital pulse by is generated during a second half of the cycle of the reference clock (i.e., while the clock is high). The digital bn and bp signals are converted into analog signals by LC matching networks that differentially drive the transformer 335 to produce the RF signal. Driving the RF signal during both the high and low parts of the AC cycle as with the circuits of FIGS. 3A, 3B, or 3C gives a less distorted RF signal than driving only during the high part of the AC cycle as with FIG. 2A.

Figure 4A:
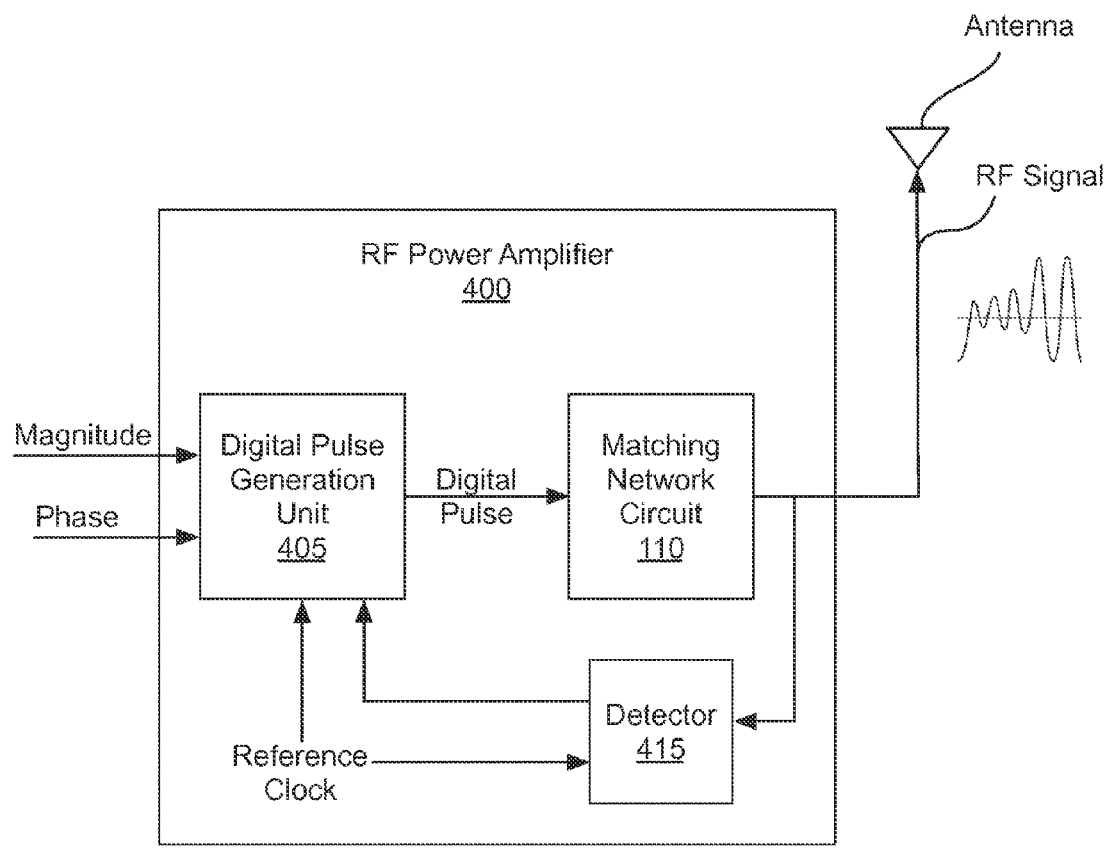
FIG. 4A illustrates a RF power amplifier using feedback control, accordance with one embodiment.

FIG. 4A illustrates a RF power amplifier 400 using feedback control, in accordance with one embodiment. The RF power amplifier 400 includes a digital pulse generation unit 405, the matching network circuit 110, and a detector 415. The detector 415 receives the RF signal and measures the magnitude of the in-phase and quadrature components of the RF signal generated by the RF power amplifier 400 (I and Q) and provides feedback to the digital pulse generation unit 405. In one embodiment, corrected phase and magnitude inputs are generated by the detector 415 and are provided to the digital pulse generation unit 405. In one embodiment, the detector 415 is implemented as a pair of gated integrators. When the measured I and Q are not equal to the current (i.e., input) I and Q corresponding to the magnitude and phase inputs, the detector 415 may control the digital pulse generation unit 405 to correct for the differences (i.e., errors). In one embodiment, the detector 415 computes a complex error signal EI and EQ and calculates phase and magnitude value to drive the digital pulse generation unit 405 to reduce the error signal. The correction function of the detector 415 may be used to calibrate the RF power amplifier 400.

In one embodiment, the detector 415 is used to quickly transition from transmitting one symbol to another symbol, where each symbol corresponds to a unique magnitude and phase input combination. The digital pulse generation unit 405 receives the measured I and Q values and computes a difference vector D=C−P representing the difference between the previous symbol P associated with the magnitude and phase inputs and a new symbol C corresponding to new magnitude and/or phase inputs. The unit may also calculate an error vector E=C−O representing the difference between the current state of the tank circuit O (as measured by the detector 415), and the current symbol C. In one embodiment, the detector 415 computes difference phase and magnitude inputs corresponding to the difference vector and provides the difference phase and magnitude inputs to the digital pulse generation unit 405. The difference vector is then used for a short time to generate digital pulse signals to control the matching network circuit 110 to quickly transmit the new symbol. For example, a symbol with magnitude 1 and phase $\pi/4$ is being transmitted and then a transition to a symbol with magnitude 1 and phase $3\pi/4$ occurs. The transition to the new symbol can be accelerated by sending the difference symbol with the maximum magnitude (e.g., 1) and phase $\pi$ for a period of time sufficient to push the state of the matching network circuit 110 to the new phase. The difference vector is the complex number given by subtracting the previous symbol (or the current detected state) from the current symbol.

The generation of the digital pulse can be determined using closed loop feedback as shown in FIG. 4A or by using an open loop method. The open-loop method can also accelerate the transition between symbols by transmitting the difference symbol for a period of time calculated to push the matching network to the new state. The digital pulse generation units 105 and 345 may be configured to operate with closed loop feedback by including the detector 4150

Open loop control may be implemented by using a model of the tank circuit to predict when the new symbol is produced by the matching network circuit 110 after a transition. Hybrid control strategies are also possible where slow feedback is used to calibrate the model of the tank circuit and model-based control is used for the cycle-by-cycle control performed by the digital pulse generation unit 405. If the Q is sufficiently low so that oscillations die out in less than half a symbol time, the simple open-loop control shown in FIGS. 1A, 2A, and 3C without feedback may be used.

Figure 4B:
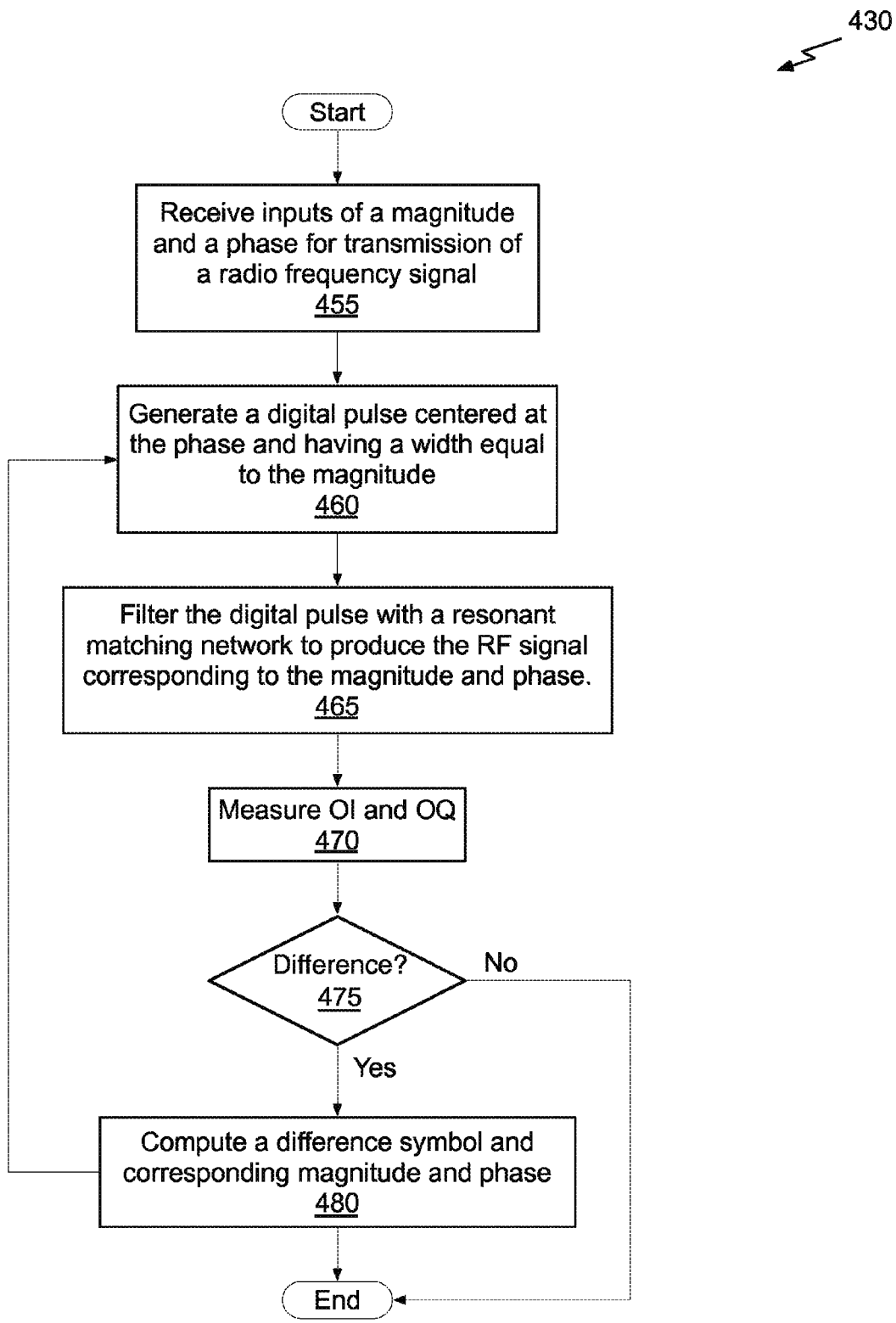
FIG. 4B illustrates a flowchart of a method for controlling the RF power amplifier shown in FIG. 4A, in accordance with one embodiment.

FIG. 4B illustrates a flowchart of a method 430 for controlling the RF power amplifier shown in FIG. 4A, in accordance with one embodiment. At step 455, a magnitude input and a phase input are received for transmission of the RF signal by the RF power amplifier 400. At step 460, a digital pulse centered at the phase and having a width equal to the magnitude is generated by the digital pulse generation unit 405. At step 465, the digital pulse is filtered with the matching network circuit 110 to produce the RF signal corresponding to the magnitude and phase.

At step 470, the detector 415 measures the magnitude of the in-phase and quadrature components of the RF signal generated by the matching network circuit 110. At step 475, the digital pulse generation unit 405 determines if there is a difference between the measured phase and magnitude and the phase and magnitude inputs, and, if not, the process is complete. Otherwise, at step 480, the digital pulse generation unit 405 computes a difference symbol and corresponding magnitude and phase values before returning to step 460 to generate a digital pulse based on the difference symbol.

Figure 5A:
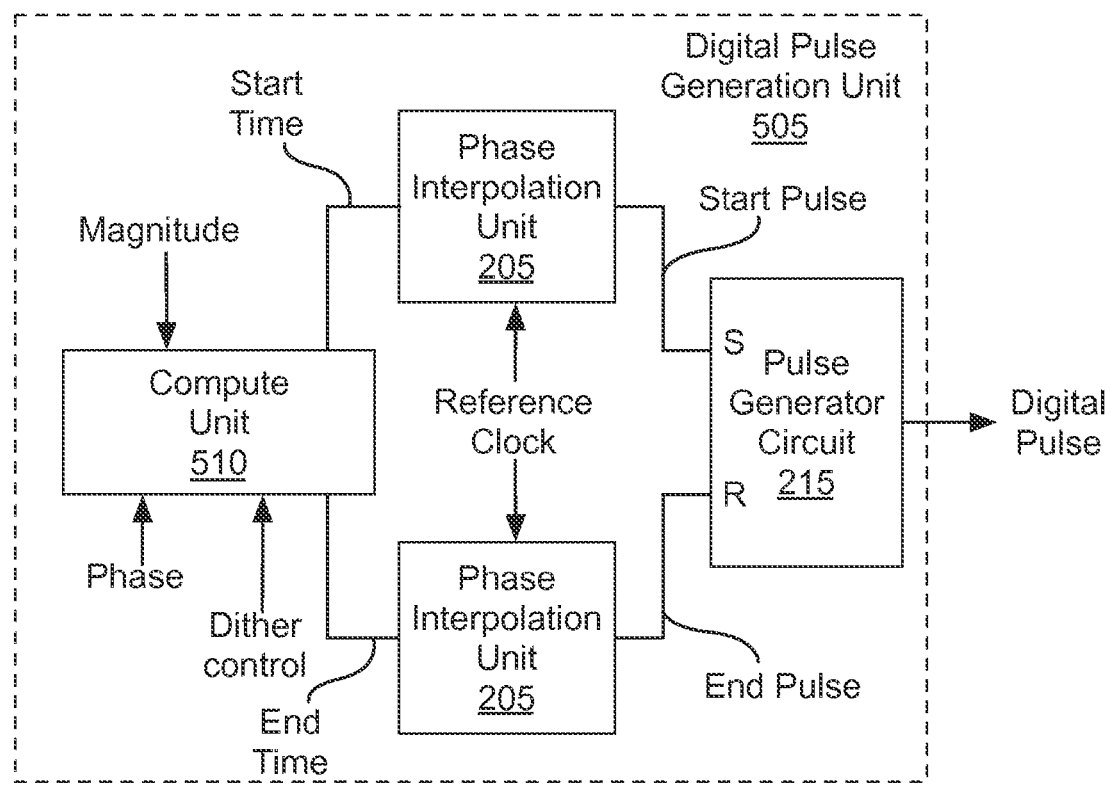
FIG. 5A illustrates a digital pulse generation unit, in accordance with another embodiment.

FIG. 5A illustrates a digital pulse generation unit 505, in accordance with another embodiment. The precision of the start and end of the digital pulse may be increased by varying the time (e.g., start time or end time) input to the phase interpolation units 205 when the Q of the tank circuit is sufficiently high. The dither control signal is used by the compute unit 510 to vary the start and/or end times to interpolate between two different values over multiple cycles of the reference clock. For example, an additional least significant bit of resolution for the start and stop times can be achieved by configuring the compute unit 510 to alternate between two values over adjacent cycles, or two additional least significant bits of resolution may be achieved by averaging over four cycles (e.g., 25% and 75%). A duty cycle of the dither control is used to control the interpolation between the two values.

Figure 5B:
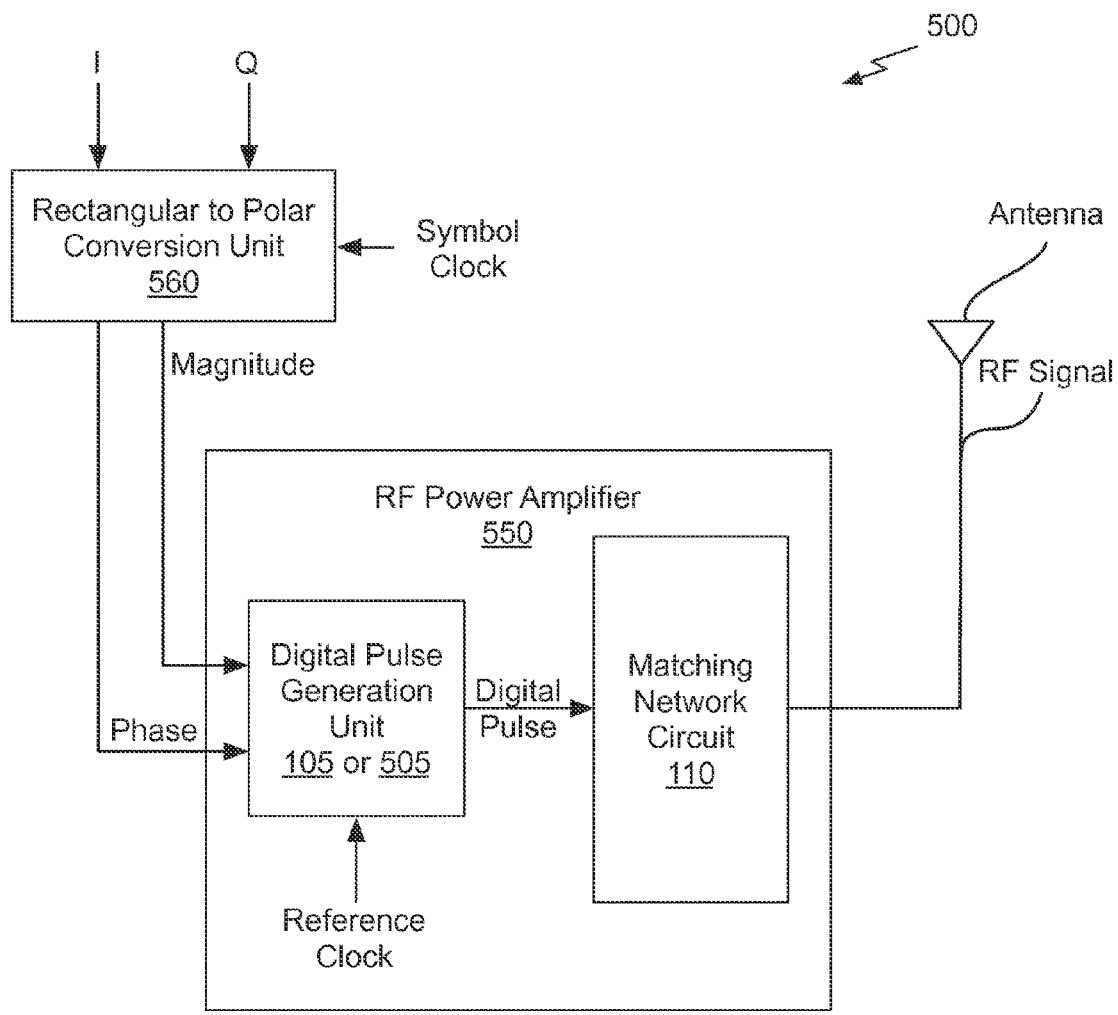
FIG. 5B illustrates a system including a RF power amplifier, according to one embodiment.

FIG. 5B illustrates a system 500 including a RF power amplifier 550, according to one embodiment. The system 500 includes a rectangular to polar conversion unit 560, the RF power amplifier 550, and an antenna. The RF power amplifier 550 may include either the digital pulse generation unit 105 or 505 and the matching network circuit 110.

The rectangular to polar conversion unit 560 accepts a complex input (with in-phase I, and quadrature Q components that are each b-bits wide) for each symbol. The I and Q inputs are clocked in with a symbol clock. The rectangular to polar conversion unit 560 also receives a reference clock, at the output frequency. The rectangular to polar conversion unit 560 digitally converts the input I and Q components to the phase and magnitude inputs. In one embodiment, b is 3, and the 3-bit I and Q components are translated to higher precision phase and magnitude values of 6 and 5 bits, respectively. When the rectangular to polar conversion unit 560 is used with the RF power amplifier, the I and Q components are used to generate a digital signal of periodic digital pulses at the RF frequency to produce the RF signal.

Figure 6:
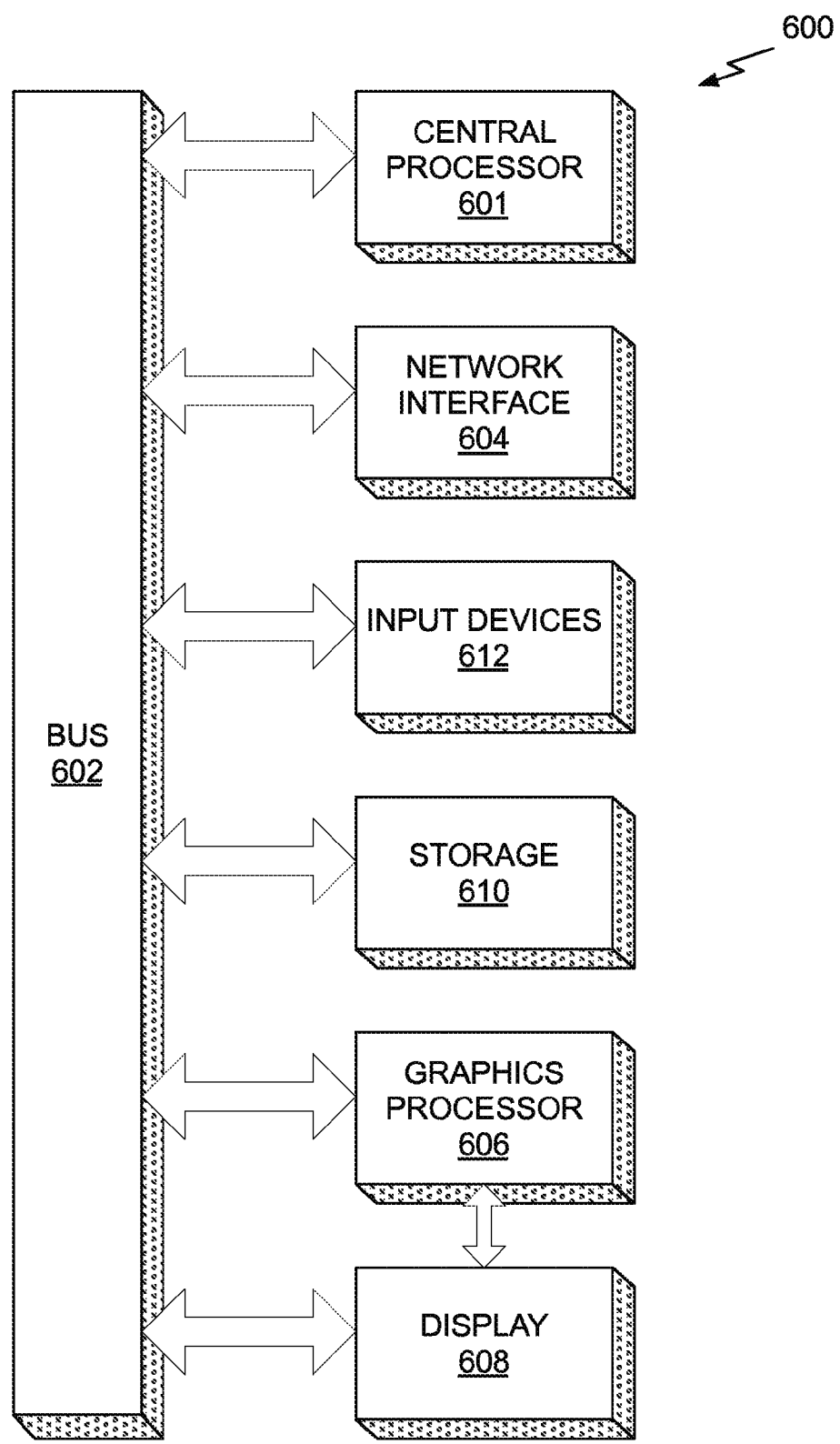
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 also includes a network interface 604 that may be coupled to a network (e.g., a telecommunications network, local area network (LAN), wireless network, wide area network (WAN) such as the Internet, peer-to-peer network, cable network, or the like) for communication purposes. One or more of the systems shown in FIGS. 1A, 2A, 3B, 3C, 4A, 5A, and 5B, may be incorporated in the system 600 to provide at least a portion of the network interface 604.

The system 600 may also include storage 610. The storage 610 may include a main memory and/or secondary storage. Control logic (software) and data are stored in the main memory which may take the form of random access memory (RAM). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory and/or the secondary storage. Such computer programs, when executed, enable the system 600 to perform various functions. The storage 610 and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   receiving a magnitude input and a phase input for transmission of a radio frequency (RF) signal by a RF power amplifier;
   generating a digital pulse having a center position relative to an edge of a reference clock based on the phase input and having a width based on the magnitude input, wherein the digital pulse is generated during a first half of a cycle of the reference clock;
   generating, during a second half of a cycle of the reference clock, a second digital pulse having a phase displaced 0.5 UI (unit interval) from a phase of the first pulse and having a width equal to the first pulse;
   filtering the digital pulse with a resonant matching network to produce the RF signal corresponding to the magnitude input and the phase input; and
   filtering the second digital pulse with a second resonant matching network.

2. The method of claim 1, wherein the resonant matching network comprises a tank circuit including an inductor and a capacitor.

3. The method of claim 2, wherein a surface acoustic wave filter is coupled between the tank circuit and an antenna.

4. The method of claim 1, wherein the filtering with the resonant matching network further comprises transforming an impedance at an input to the resonant matching network to match an impedance of an antenna that is coupled to the resonant matching network.

5. The method of claim 1, wherein the filtering with the resonant matching network further comprises resonating at a frequency of the RF signal to convert the digital pulse to an analog signal.

6. The method of claim 1, wherein the resonant matching network and the second resonant matching network are coupled to opposing terminals of a primary winding of a transformer.

7. The method of claim 6, wherein the transformer is a transmission-line transformer.

8. The method of claim 1, further comprising:
   measuring in-phase and quadrature components of the RF signal; and
   computing a corrected phase input and a corrected magnitude input.

9. The method of claim 1, further comprising:
   receiving new in-phase and quadrature components for a new symbol;
   measuring in-phase and quadrature components of the RF signal; and
   computing an error phase input and an error magnitude input based on the received in-phase and quadrature components and the measured in-phase and quadrature components.

10. The method of claim 1, wherein the magnitude input and the phase input correspond to previous in-phase and quadrature components, and further comprising:
    receiving new in-phase and quadrature components for a new symbol; and
    computing a difference phase input and a difference magnitude input based on the previous in-phase and quadrature components and the new in-phase and quadrature components.

11. The method of claim 1, wherein generating the digital pulse comprises:
    computing a start time for the digital pulse; and
    varying the start time between two different values over multiple cycles of the reference clock to increase the resolution of the start time.

12. A radio frequency (RF) power amplifier circuit, comprising:
    a digital pulse generation circuit configured to:
        receive a magnitude input and a phase input for transmission of a RF signal; and
        generate a digital pulse having a center position relative to an edge of a reference clock based on the phase input and having a width based on the magnitude input;
    a resonant matching network circuit that is coupled to the digital pulse generation circuit and configured to filter the digital pulse to produce the RF signal corresponding to the magnitude input and the phase input and
    a second resonant matching network, wherein the digital pulse generation circuit is further configured to:
        generate the digital pulse during a first half of a cycle of the reference clock; and
        generate, during a second half of a cycle of the reference clock, a second digital pulse with a phase displaced 0.5 UI (unit interval) from a phase of the first digital pulse and width equal to the first digital pulse, wherein the second digital pulse is filtered with the second resonant matching network.

13. The RF power amplifier circuit of claim 12, wherein the resonant matching network comprises a tank circuit including an inductor and a capacitor.

14. The RF power amplifier circuit of claim 13, further comprising a surface acoustic wave filter that is coupled between the tank circuit and an antenna.

15. The RF power amplifier circuit of claim 12, wherein the resonant matching network is further configured to transform an impedance at an input to the resonant matching network to match an impedance of an antenna that is coupled to the resonant matching network.

16. The RF power amplifier circuit of claim 12, wherein the resonant matching network is further configured to resonate at a frequency of the RF signal to convert the digital pulse to an analog signal.

17. The RF power amplifier circuit of claim 12, wherein the resonant matching network and the second resonant matching network are coupled to opposing terminals of a primary winding of a transformer.

18. The RF power amplifier circuit of claim 12, further comprising a detector coupled between the digital pulse generation circuit and the resonant matching network and configured to:

measure in-phase and quadrature components of the RF signal; and compute a corrected phase input and a corrected magnitude input.

\* \* \* \* \*